(12) United States Patent
Yanagawa et al.

(10) Patent No.: US 7,755,893 B2
(45) Date of Patent: Jul. 13, 2010

(54) DISPLAY DEVICE

(75) Inventors: Hiroto Yanagawa, Osaka (JP); Hiroaki Takezawa, Nara (JP)

(73) Assignee: Panasonic Corporation, Osaka (JP)

( * ) Notice: Subject to any disclaimer, the term of this patent is extended or adjusted under 35 U.S.C. 154(b) by 345 days.

(21) Appl. No.: 11/816,650

(22) PCT Filed: Mar. 15, 2006

(86) PCT No.: PCT/JP2006/305127

§ 371 (c)(1),
(2), (4) Date: Aug. 20, 2007

(87) PCT Pub. No.: WO2006/098365

PCT Pub. Date: Sep. 21, 2006

(65) Prior Publication Data

US 2009/0009047 A1    Jan. 8, 2009

(30) Foreign Application Priority Data

Mar. 15, 2005    (JP) .............................. 2005-073423

(51) Int. Cl.
*H05K 7/20* (2006.01)
*H05K 5/00* (2006.01)
*G06F 1/20* (2006.01)

(52) U.S. Cl. ............... 361/695; 361/679.48; 361/679.5; 361/679.51; 361/692; 361/694; 345/905; 348/748; 454/184

(58) Field of Classification Search ............ 361/679.46, 361/679.48, 679.5, 679.51, 690, 692–695; 165/80.3; 174/16.1; 313/46, 582; 345/60, 345/905; 348/748–749; 349/161; 312/223.1–223.2, 312/236; 454/184
See application file for complete search history.

(56) References Cited

U.S. PATENT DOCUMENTS 6,307,530 B1 * 10/2001 Cho ............................ 345/87

(Continued)

FOREIGN PATENT DOCUMENTS

JP    2000156581 A   *   6/2000

(Continued)

OTHER PUBLICATIONS

English translation of Japanese publuication JP2001-035397.*

(Continued)

*Primary Examiner*—Jayprakash N Gandhi
*Assistant Examiner*—Robert J Hoffberg

(57) ABSTRACT

The present invention provides a display apparatus that can achieve high durability by making the most of the function of the exhaust fans to effectively suppress the rise of the temperature. The display apparatus comprises a display panel for displaying images, a rear case covering a rear side of the display panel, and an exhaust fan disposed within the rear case, wherein the rear case includes a first air-hole area and a second air-hole area each provided with a plurality of air holes, the first air-hole area is located at a higher level than the second air-hole area with respect to a vertical direction with a spacing therebetween, and at least partially faces the exhaust fan, and an area surrounded by the first air-hole area, the second air-hole area and external common tangents thereof is a shielded area in which no air hole is provided.

3 Claims, 13 Drawing Sheets

U.S. PATENT DOCUMENTS

| | | | | |
|---|---|---|---|---|
| 6,563,705 B1 * | 5/2003 | Kuo | | 361/679.54 |
| 6,697,250 B2 * | 2/2004 | Kuo | | 361/679.6 |
| 6,825,828 B2 * | 11/2004 | Burke et al. | | 345/101 |
| 6,882,108 B2 * | 4/2005 | Kim et al. | | 313/582 |
| 7,038,360 B2 * | 5/2006 | Bae et al. | | 313/46 |
| 7,259,964 B2 * | 8/2007 | Yamamura et al. | | 361/697 |
| 7,269,009 B2 * | 9/2007 | Ryu et al. | | 361/692 |
| 7,369,400 B2 * | 5/2008 | Bang et al. | | 361/679.27 |
| 7,508,655 B2 * | 3/2009 | Baek | | 248/917 |
| 7,521,848 B2 * | 4/2009 | Kim et al. | | 313/24 |
| 7,522,416 B2 * | 4/2009 | Kim et al. | | 361/695 |
| 2004/0036413 A1 * | 2/2004 | Bae et al. | | 313/582 |
| 2004/0036819 A1 | 2/2004 | Ryu et al. | | |
| 2004/0090560 A1 * | 5/2004 | Jang | | 348/836 |
| 2005/0047067 A1 * | 3/2005 | Bang et al. | | 361/681 |
| 2009/0180042 A1 * | 7/2009 | Furukawa et al. | | 348/836 |

FOREIGN PATENT DOCUMENTS

| | | |
|---|---|---|
| JP | 2001-35397 | 2/2001 |
| JP | 2003-29648 | 1/2003 |
| JP | 2003-162228 | 6/2003 |
| JP | 2007171336 A * | 7/2007 |

OTHER PUBLICATIONS

English translation of Japenese publication JP2003-029648.*
English translation of Japenese publication JP2003-162228.*

* cited by examiner

|  | F1 | F2 | F3 | F4 | F5 | F6 |
|---|---|---|---|---|---|---|
| COMPARATIVE EXAMPLE 1 | — | — | — | — | — | — |
| COMPARATIVE EXAMPLE 2 | +13 | +2 | +11 | +3 | +11 | +5 |
| PRACTICAL EXAMPLE 1 | 0 | -6 | 0 | -5 | +4 | 0 |

FIG.10A
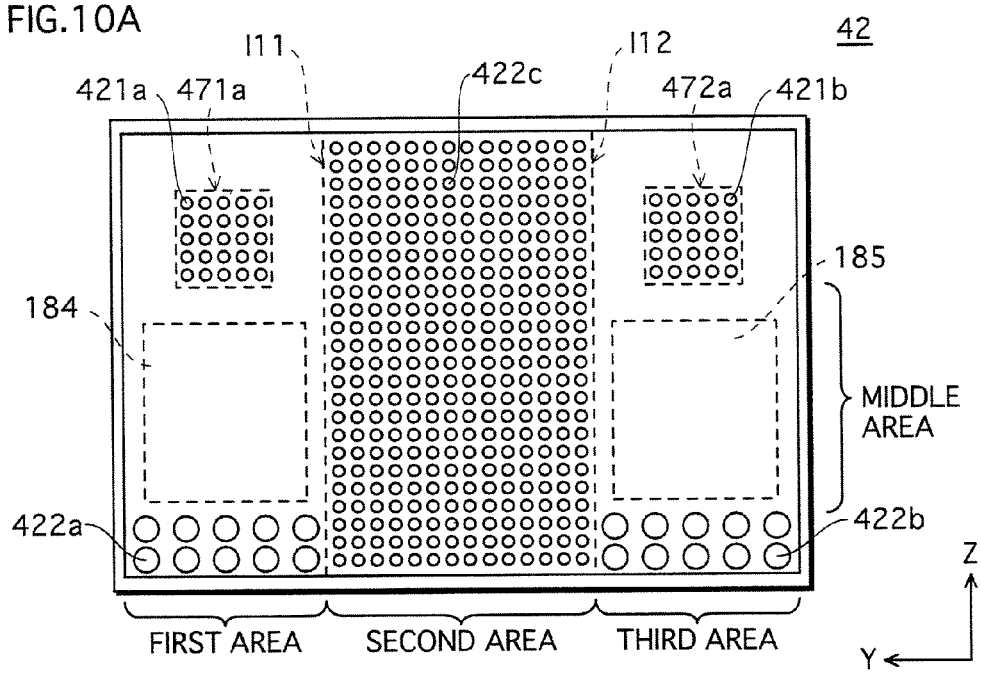
FIG.10B
|  | F1 | F2 | F3 | F4 | F5 | F6 |
|---|---|---|---|---|---|---|
| COMPARATIVE EXAMPLE 1 | — | — | — | — | — | — |
| PRACTICAL EXAMPLE 2 | 0 | -6 | 0 | -9 | 0 | 0 |
FIG.10C
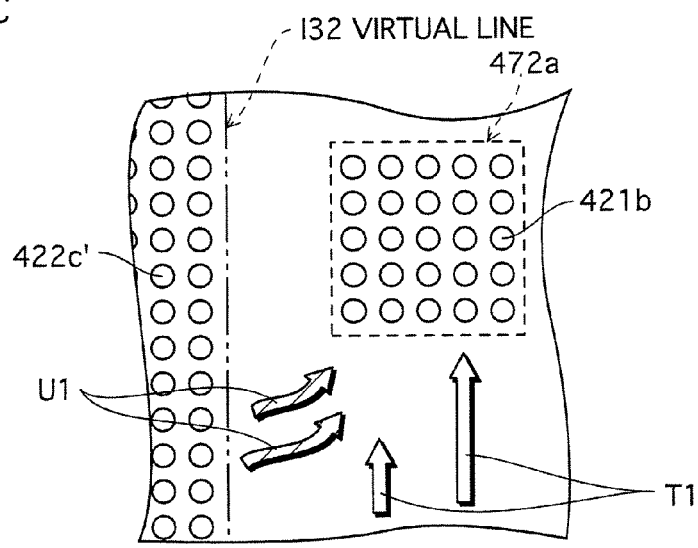

FIG.14

| | PARTITION PLATE | AIR HOLE 622c | POSITION OF AIR HOLE 630 | AIR FLOW SPEED (m/s) AT DATA DRIVER SURFACE | TEMPERATURE (°C) | |
|---|---|---|---|---|---|---|
| | | | | | DATA DRIVER | PDP CENTER |
| PRACTICAL EXAMPLE 1 | PRESENT | PRESENT | REAR PART | 0.19 | 72.7 | 73.8 |
| PRACTICAL EXAMPLE 2 | ABSENT | PRESENT | REAR PART | 0.16 | 73.3 | 74.5 |
| PRACTICAL EXAMPLE 3 | PRESENT | PRESENT | BOTTOM PART | 0.16 | 73.6 | 74.5 |
| PRACTICAL EXAMPLE 4 | PRESENT | PRESENT | ADJOINING PART | 0.14 | 74.8 | 75.7 |
| COMPARATIVE EXAMPLE 3 | ABSENT | ABSENT | REAR PART | 0.06 | 80.5 | 79.5 |
| COMPARATIVE EXAMPLE 4 | ABSENT | PRESENT | ABSENT | 0.02 | 93.6 | 91.1 |

DISPLAY DEVICE

TECHNICAL FIELD

The present invention relates to a rear case of a display apparatus such as a plasma display apparatus, and particularly relates to a technique to efficiently radiate heat generated in the apparatus to outside the apparatus.

BACKGROUND ART

In a plasma display panel apparatus (Hereinafter called "a PDP apparatus"), image display is performed using plasma discharge. Accordingly, in general, a panel case, many electronic elements and the likes generate heat to drive the panel. If this heat remains inside the apparatus, the panel and the electronic elements are exposed to an unfavorable temperature environment. As a result, the life and the performance of the apparatus can be degraded. In view of this problem, some measures are taken, e.g., suppressing the heat by various methods and providing many air holes in the rear case. Especially, since the heat generation amount has been increasing recently with the realization of a function of display apparatuses for displaying high-luminance images, the importance of such measures is increasing.

An example of such measures is explained next with reference to FIG. 15. FIG. 15 is a lateral cross-section view schematically showing the structure of a PDP apparatus 900. The PDP apparatus 900 includes a front case 901 and a rear case 902 between which a frame 903 intervenes. A plasma display panel (Hereinafter called the "PDP") 905 is cased in the front case 901. An optical filter 904 is placed over an opening of a front panel. The rear case 902 has therein a circuit substrate 911, an electronic device 912, and other many electronic elements. The temperature of the space within the rear case 902 (hereinafter called "the rear space") rises due to the heat generated by the electronic elements and the heat generated by the PDP 905 and radiated by the frame 903. Therefore, to lower the temperature of the rear space, air holes 921, 922 and 923 are provided in the rear case 902 in view of the flow of air from the bottom to top. Furthermore, with use of a function of an exhaust fan 906, circulation of the air is promoted (See Patent Document 1, for example). Patent Document 1: Japanese Laid-open Patent Application Publication No. 2003-29648.

DISCLOSURE OF THE INVENTION

Problems to be Solved by the Present Invention

However, with the structure stated in the Patent Document 1, the flow of air from the bottom to the top of the rear space might be obstructed due to the structure having many passages for the intake air. As a result, the heat radiation efficiency of the rear space can not be secured, and parts generating heat at high temperature can not be cooled enough.

Moreover, if the air hole 922 is provided in the vicinity of the area opposing the exhaust fan 906, the outside air might flow in through the air hole 922. This burdens the exhaust fan 906.

As a result, the function of the exhaust fan can not be fulfilled in the rear space. It seems that there is room for improvement in terms of the heat radiation of the display apparatus. In particular, in the case where electronic elements that generates heat at high temperature are provided, the temperature of a solder used for attaching the devices to the circuit substrate greatly rises, and this causes cracks in the circuit substrate, which lead to a poor connection. This problem is not limited to PDP apparatuses, but may happen in other display apparatuses as well.

Means for Solving the Problems

The present invention is made in terms of the problems above, and aims to provide a durable display apparatus in which an exhaust fan properly fulfills the function thereof to efficiently suppress a rise in temperature.

To achieve this object, the present invention provides a display apparatus comprising a display panel for displaying images, a rear case covering a rear side of the display panel, and an exhaust fan disposed within the rear case, wherein the rear case includes a first air-hole area and a second air-hole area each provided with a plurality of air holes, the first air-hole area is located at a higher level than the second air-hole area with respect to a vertical direction with a spacing therebetween, and at least partially faces the exhaust fan, and an area surrounded by the first air-hole area, the second air-hole area and external common tangents thereof is a shielded area in which no air hole is provided. Note that the "shielding" means to shield movement of air between the space surrounded by the display panel and the rear case and the external space.

A drive circuit for driving the display panel is disposed in an inner space surrounded by the display panel and the rear case, the drive circuit including a circuit substrate on which a plurality of electronic parts are mounted. In the inner space, an electronic part that generates the largest amount of heat among the plurality of electronic parts is located in a space between the shielded area and the display panel.

It is preferable that the rear case further includes a third air-hole area, and the third air-hole area is located a prescribed distance away from the exhaust fan. Also, it is preferable that the third air-hole area is located substantially at the same level as the exhaust fan with respect to the vertical direction, and the third air-hole area is located a first distance away from the exhaust fan in a horizontal direction. Furthermore, it is preferable that $a1 \geq 0.6b$ is satisfied, where $a1$ (m) is the first distance and $b$ (m³/min.) is an amount of exhaust from the exhaust fan.

Moreover, the third air-hole area may include two or more air-hole areas including a main third air-hole area and a sub third air-hole area, the main third air-hole area being located substantially at the same level as the exhaust fan with respect to the vertical direction and a first distance away from the exhaust fan in the horizontal direction, and the sub third air-hole area being located at a higher level than the second air-hole area with respect to the vertical direction and a second distance away from the exhaust fan in the horizontal direction. Here, it is preferable that $a1 \geq 0.6b$ and $a2 \geq 0.17b$ are satisfied, where $a1$ (m) is the first distance, $a2$ (m) is the second distance, and $b$ (m³/min.) is an amount of exhaust from the exhaust fan.

Furthermore, the third air-hole area may be located at a higher level than the exhaust fan with respect to the vertical direction, and the third air-hole area may be located a second distance away from the exhaust fan in the horizontal direction. Here, it is preferable that $a2 \geq 0.17b$ is satisfied, where $a2$ (m) is the second distance, and $b$ (m³/min.) is an amount of exhaust from the exhaust fan.

Also, the shielded area may include two sub areas respectively located at both side ends of the rear case with respect to a horizontal direction with a spacing therebetween, and the third air-hole area may be located in a middle of the rear case with respect to the horizontal direction.

Also, the third air-hole area may include two sub areas respectively located at both side ends of the rear case with respect to a horizontal direction with a spacing therebetween, and the shielded area may be located in a middle of the rear case with respect to the horizontal direction. Here, it is preferable that the two sub areas of the third air-hole area are respectively located only in upper parts of the side ends of the rear case.

In each of the stated structures, a partition may be disposed along the external common tangents. Note that it is preferable that the inner space is separated by the partition. Also, it is preferable that the exhaust fan is located in an area extending from a top end of the rear case and having a length that is not more than 10% of a length of the rear case in the vertical direction.

Also, the third air-hole area may be located at a lower level than the second air-hole area with respect to the vertical direction with a spacing therebetween. Furthermore, it is preferable that a partition is disposed between the third air-hole area and the second air-hole area so that a flow of air in the vertical direction is obstructed. Moreover, it is preferable that a data driver IC is disposed in the inner space so as to face the third air-hole area. Here, the third air-hole area, shown in the description "so as to oppose the third air-hole area", is provided not only in the area that is exactly the same as the area where the data driver ICs are provided, but also in the vicinity of the area where the data driver ICs are provided.

The inside diameter of each air hole described above is within a range from 2 mm to 8 mm inclusive. If it is smaller than 2 mm, exhaust and intake of air can not be performed properly. On the other hand, if it is larger than 8 mm, the strength of the case is lowered and the case can not properly fulfill its function. Also, intake of air is not performed between the exhaust fan areas and the second air holes so as not to obstruct the air flow in the rear space.

Advantageous Effects of the Present Invention

In the present invention, the rear case includes a first air-hole area and a second air-hole area, and no air-hole is provided in the shielded area surrounded by the first air-hole area, the second air-hole area and external common tangents thereof. With this structure, smooth air flow within the rear space can be secured using the function of the exhaust fans, and accordingly radiation effect can be improved. Therefore, at least in the shielded area, even if the temperature of the air rises, it is possible to exhaust the air to the outside using the function of the exhaust fan, while the air flow from the second air-hole area to the first air-hole area is not obstructed. Since a circuit substrate on which a drive circuit for the display panel is mounted especially generates a large amount of heat, if the circuit substrate is provided in the shielded area, the radiation effect is further improved and the temperature of the rear space is greatly lowered.

Moreover, by providing a third air-hole area at a position that is outside the shielded area and away from the exhaust fan area, it is possible to exhaust air that can not be directly exhausted by the exhaust fan. This further improves the radiation effect within the rear space.

With the stated structure, it is possible to radiate the heat generated by the area in which electronic elements are provided, whose temperature is especially necessary to be lowered. This also improves the durability of the display apparatus.

BRIEF DESCRIPTION OF THE DRAWINGS

FIG. 10 is a plan view schematically showing a rear case according to the second embodiment;

FIG. 14 is a results of temperature measurement according to the fourth embodiment.

Figure 1A:
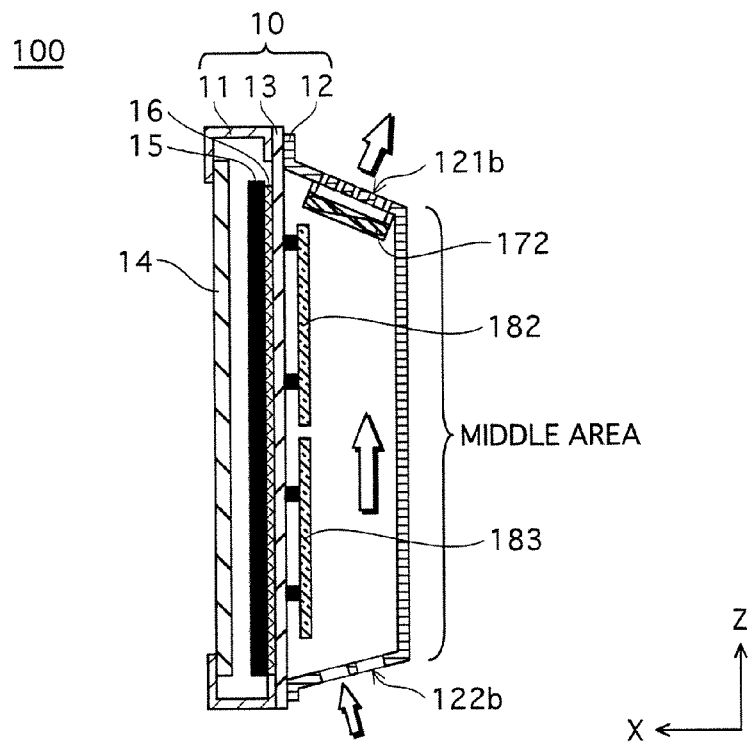
FIG. 1A is a lateral cross-section view of a PDP apparatus according to the first embodiment.

DESCRIPTION OF NUMBERING 10 case
11 front case
12 rear case
13 frame chassis
14 optical filter
15 plasma display panel
16 thermally-conductive member
121$a$, 121$b$ fan exhaust hole group
122$a$, 122$b$ intake hole group
122$c$, 122$d$, 122$e$ natural exhaust fan group
171, 172 exhaust fan
171$a$, 172$a$ fan area
181 signal processing circuit substrate
182 power source circuit substrate
183 TV tuner circuit substrate
184 scan drive circuit substrate
185 sustain drive circuit substrate

BEST MODE FOR CARRYING OUT THE INVENTION

To show the characteristics of the present invention, the following explains an embodiment using a PDP apparatus an example, with reference to the drawings.

First Embodiment

Overall Structure

Figure 1B:
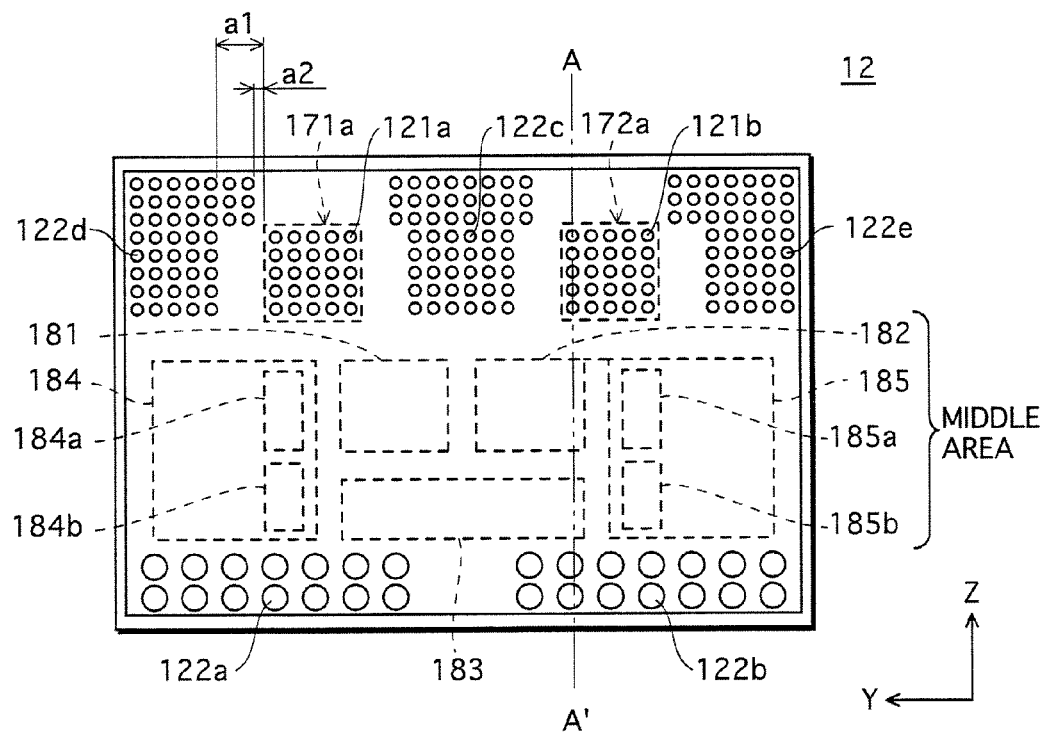
FIG. 1B is a plan view schematically showing the PDP apparatus.

FIG. 1A is a lateral cross-section view of a PDP apparatus 100, and FIG. 1B is a plan view schematically showing the rear side of the PDP apparatus 100. The cross section shown in FIG. 1 corresponds to the cross section cut along A-A' shown in FIG. 1B.

As FIG. 1A shows, in the PDP apparatus 100, a case 10 is structured with a front case 11 made of organic resin and a rear case 12 made of thermally-conductive metal such as aluminum (Al), between which a frame chassis 13 of aluminum die-cast intervenes.

The front case 11 has an opening on the front side (the side indicated by an arrow X) and a filter 14 is placed to cover the opening. This filter 14 prevents electromagnetic rays and infrared rays, and improves the contrast. Within the front case 11, a thermally-conductive sheet 16 and a PDP 15 (e.g. 42-inch type) are disposed on the frame chassis 13 in this order. The frame chassis 13 radiates the heat generated by the gas discharge of the PDP 15 to inside the rear case 12, which is described later.

The rear case 12 is in contact with the frame chassis 13 at the end thereof, as illustrated in the drawing. The rear case 12 is partially bent, and the distance between the frame chassis 13 and the rear case 12 is longer at a center part of the rear case 15 than at the end part. A part of the rear case 12 has a flat shape. The distance between the flat part and the frame chassis 13 is approximately 60 mm. Also, the rear case 12 has a plurality of air holes. Specifically, exhaust holes 121b are formed in the top side (a first air-hole area) of the rear case 12 (the side indicated by an arrow Z), and intake holes 122b are formed in the bottom side (a second air-hole area) of the rear case 12 (the side opposite to the side indicated by the arrow Z). An exhaust fan 172 is disposed on the first area where the exhaust holes 121b are formed. Note that the area between the first area and the second area, especially the flat area, is a shielded area in which no air hole is provided.

The following specifically explains positions of the exhaust holes, with reference to FIG. 1B.

As FIG. 1B shows, the rear case 12 has many air holes. Air hole groups 122a and 122b as air intakes (hereinafter called "the intake hole groups") are formed in the bottom side (the side opposite to the side indicated by the arrow Z), and air hole groups 121a, 121b, 122c, 122d and 122e as exhaust holes (hereinafter called "the exhaust hole groups) are formed. The exhaust hole groups 121a, 121b, 122c, 122d and 122e are respectively arranged in different manners. For example, each of the exhaust hole groups 121a and 121b is arranged in a 5×5 matrix shape, and each of the exhaust hall groups 122c, 122d and 122e is arranged in a 8×7 (or 8×8) matrix shape that includes a part where air holes are not formed.

The exhaust hole groups 121a and 121b are formed at a certain distance from a middle part of the rear case 12 with respect to the lateral direction (Y direction). The areas where the exhaust hole groups 121a and 121b are formed are respectively included in areas 171a and 172a, where the exhaust fan 172 is disposed (hereinafter called "the fan areas"). Meanwhile, the exhaust hole groups 122c, 122d and 122e are provided in the third air-hole area, and they can be classified into two categories, namely the exhaust hole groups 122d and 122e formed on both end parts of the rear case 12 and the exhaust hole group 122c formed on the middle part of the rear case 12, with respect to the above-mentioned lateral direction.

As shown in FIG. 1B, each of the exhaust hole groups 122d and 122e includes a main third air-hole area that is located substantially at the same level as the fan areas 171a and 172b with respect to the vertical direction (Z direction) and a sub third air-hole area that is located at a higher level than the fan areas 171a and 172b with respect to the vertical direction (Z direction). With respect to the lateral direction (Y direction), the main third air-hole area and the sub third air-hole area are respectively a given distance a1 or a2 away from the fan areas 171a and 172b. Here, a1>a2 is satisfied.

Note that the number of air holes included in the intake hole groups 122a and 122b and the exhaust hole groups 121a, 121b, 122c, 122d and 122e is not limited the number illustrated in the drawing, and it can be another number.

Various circuit substrates are disposed in the rear space. For example, as FIG. 1B shows, the scan drive circuit substrate 184 for driving the scan electrodes that control the light emission and a sustain drive circuit substrate 185 for driving the sustain electrodes, a signal processing circuit substrate 181 for processing signals, a TV tuner circuit substrate 183 for receiving TV signals, and a power source circuit substrate 182. The scan drive circuit substrate 184 and the sustain drive circuit substrate 185 are connected to the PDP by a flexible wiring part (not illustrated). Furthermore, fins 184a and 184b, each having a function of effectively radiating heat, are attached to the scan drive circuit substrate 184. In the same manner, fins 185a and 185b are attached to the sustain drive circuit 185b. These electronic elements and so on are disposed in an area between the intake hole groups 122a and 122b and the exhaust hole groups 122a, 122b, 122c, 122d and 122e (hereinafter called "the middle area").

Heat Radiation Function of the PDP Apparatus

In the PDP apparatus 100 having the stated structure, a current passes through electronic elements (not illustrated) mounted on each circuit substrate, and accordingly the electronic elements become heat sources. The heat is radiated in the rear space. Especially, electronic elements mounted on the scan drive circuit substrate 184 and the sustain drive circuit substrate 185 radiate the largest amount of heat among the electronic parts disposed in the rear space. Since a large current passes through them, heat at a high temperature is generated in a gap in the rear case between the shielded area and the PDP 15. As a result, the fins 184a, 184b, 185a and 185b radiate a large amount of heat. In addition, heat generated by the PDP 15 is conducted to the thermally-conductive sheet 16 and the frame chassis 13, and radiated into the rear space.

Figure 2A:
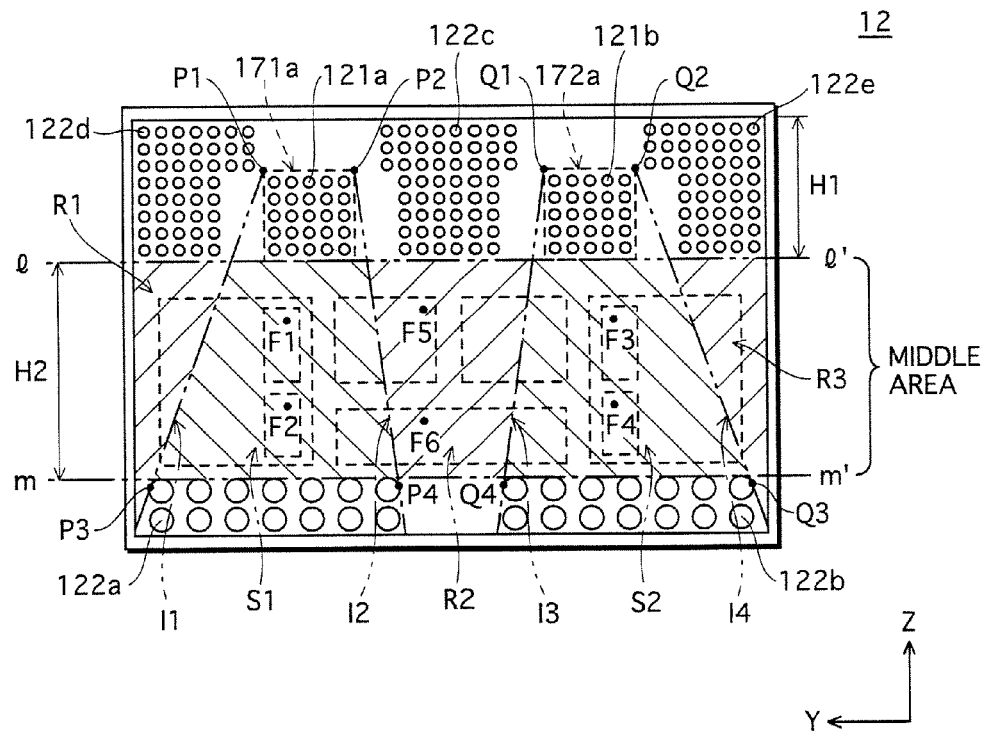
FIG. 2 is a plan view schematically showing a rear case according to the first embodiment.

As heated air rises basically in the vertical direction, the heat radiated in the rear space moves from the bottom to the top, and exhausted by the exhaust fan 172 to outside through the exhaust holes. At this moment, due to the structure according to this embodiment, the exhaust passage of the air in the rear space can be limited as described below. This is explained with reference to FIG. 2. FIG. 2 schematically shows the rear case 12 viewed from the back side in the same manner as in FIG. 1B.

Firstly, air taken from the outside into the rear space through the intake hole groups 122a and 122b moves upward. Then, the air is exhausted by the function of the exhaust fans 171 and 172 from the exhaust hole groups (hereinafter called "the fan exhaust hole groups") 121a and 121b formed in the fan areas 171a and 172a. At this moment, in the rear space, the area between virtual lines (two-dot chain lines) l-l' and m-m' includes two area groups, namely, forced convection areas S1 and S2, in which the main flow of the air is the flow caused by the function of the exhaust fans 171 and 172, and natural convection areas R1, R2 and R3, in which the main flow is of a natural convection which does not easily come under the direct influence of the exhaust fans 171 and 172. For the sake of simplification, virtual lines I1, I2, I3 and I4 which divide the forced convection areas S1 and S2 and the natural convection areas R1, R2 and R3 are drawn. As a result, the forced convection areas S1 and S2 are respectively defined as areas surrounded by the fan exhaust hole groups 121a and 121b, the intake hole groups 122a and 122b, the virtual lines I1 and I4 at the end portions of the rear case 14, and the virtual lines I2 and I3 at the center portion of the rear case 14. Here, the distance between the virtual lines l-l' and m-m'is H2. In this embodiment, it is assumed that the distance H2 is approximately 0.25 m. Also, it is assumed that a length H1 from the upper end of the rear case 12 to the upper end of the middle area (l-l' in the drawing) is 0.1 m. Note that the virtual line I1 is a straight line connecting a position P1 and a position P3, where the position P1 is on the upper end of the fan area 171a and is on the side of the outer edge of the rear case 12, and the position P3 is on the upper end of the intake hole group 122a and is on the side of the outer edge of the rear case 12. In other words, the virtual line I1 is an external common tangent with respect to the fan area 171a and the intake hole group 122a. The virtual line I2 is a straight line connecting a position P2 and a position P4, where the position P2 is on the upper end of the fan area 171a and is on the side of the center part of the rear case 12, and the position P4 is on the upper end of the intake hole group 122a and is on the side of the center part of the rear case 12. In other words, the virtual line I2 is also an external common tangent with respect to the fan area 171a and the intake hole group 122a. In the same manner, the virtual lines I3 and I4 are external common tangents with respect to the fan area 172a and the intake hole group 122b.

The air existing within the forced convection areas S1 and S2 is certainly exhausted by the function of the exhaust fans 171 and 172 through the fan exhaust hole groups 121a and 121b. Accordingly, the air taken from the intake hole groups 122a and 122b into the rear space moves over the scan drive circuit substrate 184 and the sustain drive circuit substrate 185, and lowers the temperature of the substrates due to the heat radiation. Since there is no air hole on the flow passage, the flow of the air is not obstructed. The air smoothly flows in the forced convection areas S1 and S2 without staying therein. This improves the radiation efficiency. In particular, it is preferable that the fins 184a, 184b, 185a and 185b, which are for performing the heat radiation of the scan drive circuit substrate 184 and the sustain drive circuit substrate 185 which generate large amount of heat due to the large amount of a current, are provided in the forced convection areas S1 and S2. This is because this structure can obtain an effect of certainly exhausting a large amount of heat.

Meanwhile, regarding the natural convection areas R1, R2 and R3, the air flow is not under control of the exhaust fans 171 and 172. However, the air existing within the natural convection areas R1, R2 and R3 is exhausted through exhaust hole groups 122c, 122d and 122e (hereinafter called "the natural exhaust hole groups") provided at the top part. In this way, due to the natural convection areas R1, R2 and R3, it is possible to realize an effective heat radiation from all corners of the rear space including areas where the function of the exhaust fans 171 and 172 can not be used.

With the stated structure, as to all over the rear space, the generated heat is certainly exhausted without staying therein. Particularly in this embodiment, the natural exhaust hole groups 122c, 122d and 122e are provided a certain distant away from the fan areas 171a and 172a, and no air hole is provided in the forced convection areas S1 and S2. Accordingly, the flow passages to the fan exhaust hole groups 121a and 121b are not obstructed, and it is possible to achieve the full function of the exhaust fans 171 and 172. As a result, it is possible to achieve efficient heat radiation from the rear space.

Figure 2B:
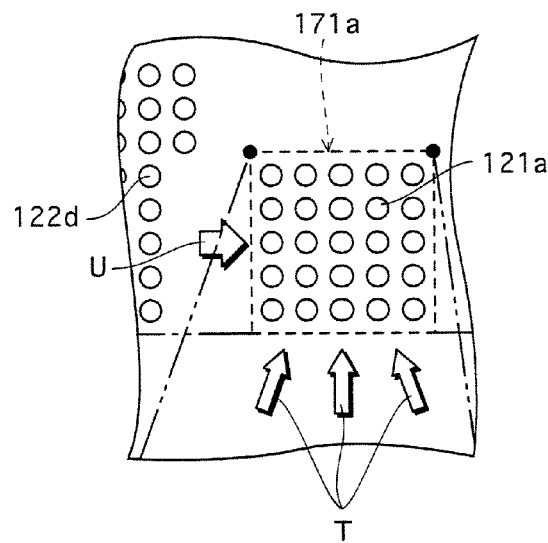

Note that the air exhausted to the outside through the fan exhaust hole groups 121a and 121b is not limited to the air existing within the forced convection areas S1 and S2. As illustrated in FIG. 2B that shows an enlarged view of the fan area 171a and the area around it, the air existing within the natural convection areas R1, R2 and R3 might be exhausted to the outside by the function of the exhaust fans 171 and 172 through the fan exhaust hole groups 121a and 121b. Even if this is the case, an amount of the flow of the air coming from the natural convection area R1 is much smaller than an amount T of the air coming from the forced convection area S1.

The Position of Natural Exhaust Hole Groups 122c, 122d and 122e

To determine the distances a1 and a2 between the natural exhaust hole groups 122c, 122d and 122e and the fan exhaust hole groups 121a and 121b, a confirmatory experiment has been conducted. The following describes the experiment.

Air holes are provided all over the area upper than the middle area of the rear case 12. Some of the air holes are covered with an adhesive sheet so as not to pass the air. A smoke source is placed right under the intake holes 122a and 122b provided in the bottom part of the rear case 12, and it is visually judged that which air holes the smoke is taken in or exhausted from. With this embodiment, it is confirmed that the smoke is taken into the rear space from the intake holes 122a and 122b, and mainly exhausted from the fan exhaust holes 121a and 121b. Given this factor, the distance from the exhaust fans 171 and 172 to the air holes that properly function as exhaust holes for a given exhaust amount of the exhaust fans 171 and 172 is visually determined. Here, to "properly function" means to certainly exhaust the smoke from the rear space to the outside.

Figures 3, 4:
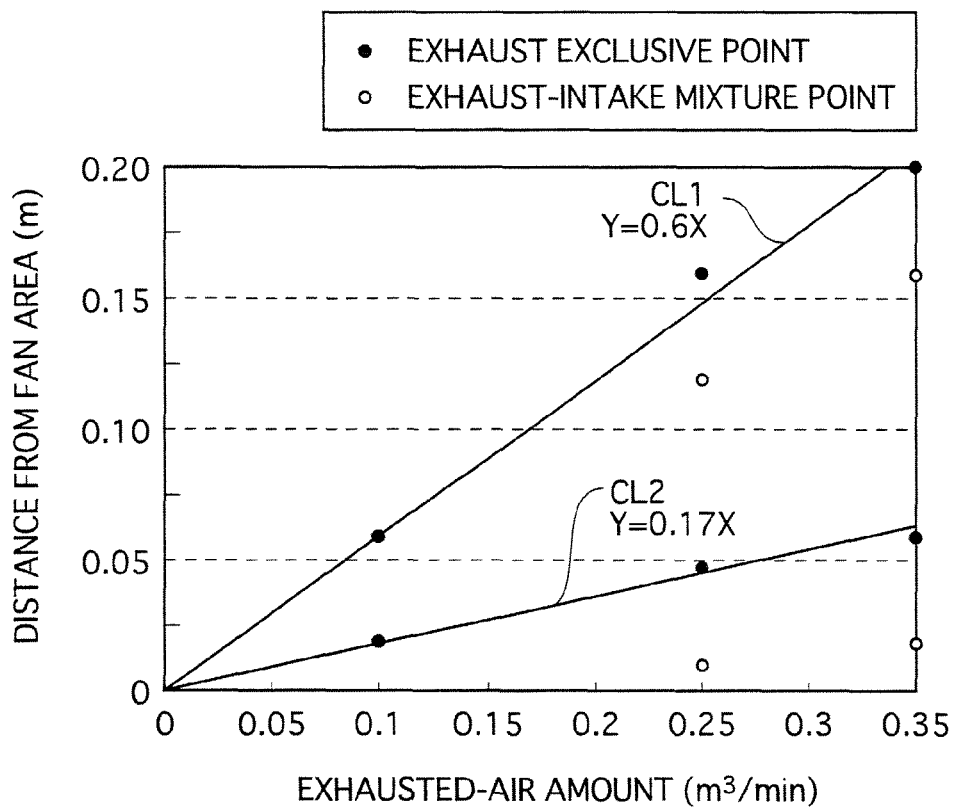
FIG. 3 is a graph showing a relation between exhausted-air amounts and positions of exhaust holes according to the first embodiment.
FIG. 4 is a table showing results of temperature measurement according to the first embodiment.

The result of this confirmatory experiment revealed that the exhausted-air amount from the exhaust fans 171 and 172 changes depending on the aperture ratio of the fan exhaust hole groups 121a and 121b. Given this, the distances a1 and a2 between the natural exhaust hole group 122d and the fan area 171a are measured. FIG. 3 shows representative results.

From the results, approximate lines CL1 and CL2 are obtained based on points showing a status where the smoke is certainly exhausted without taking air into the rear space (points illustrated as "exhaust exclusive points"), and points showing a status where exhaust is performed with taking air into the rear space through the natural exhaust hole group 122d (points illustrated as "exhaust-intake mixture points"). At the exhaust-intake mixture point, some air holes among the natural exhaust hole group 122d perform the air exhaust and the other perform the air intake. At the exhaust exclusive point, all the holes fulfill the exhaust function. Therefore, at least in the case where the value characteristic of the exhaust exclusive point is indicated, the natural exhaust hole group 122d surely performs the exhaust function. Regarding the distance from the fan area 171a, the approximate line CL1 satisfies a1=0.6b (Expression 1) with respect to a1 (m), and the approximate line CL2 satisfies a2=0.17b (Expression 2) with respect to a2 (m). Here, b is the exhausted-air amount (m3/min.) from the exhaust fans. This relations are satisfied not only between the fan area 171a and the natural exhaust hole group 122d, but also between the fan area 171a and the natural exhaust hole group 122c. Moreover, they are also satisfied between the fan area 172a and the natural exhaust hole group 122c, and the fan area 172a and the natural exhaust hole group 122e. Note that H2>a1 and H2>a2 are satisfied here. Also, regarding the length H1 of the area where the natural exhaust hole group is formed in the vertical direction (Z direction), although the exhaust performance increases as H1 increases, it is necessary to consider the lengths of the shielded area and the fan areas 171a and 172a in comparison. Therefore, it is not preferable that the length H1 is larger than necessity. Given this, based on the length of H1 (100 mm) in this embodiment and the length 600 mm of the rear case 12 in the vertical direction. The length H1 can also be set to less than 20% of the length of the rear case 12 in the vertical direction. The length H1 can also be set to be less than 10% of the length of the rear case 12 in the vertical direction.

The following are comparative examples for confirming the heat radiation effect of the natural exhaust hole groups 122c, 122d and 122e provided at positions satisfying the relation above.

COMPARATIVE EXAMPLE 1

A plurality of air holes are evenly provided in the middle area of the rear case 12. Air holes are also provided in the vicinity of the fan areas 171a and 172a without providing the above-mentioned certain distance.

COMPARATIVE EXAMPLE 2

No air hole is provided in the middle area of the rear case 12 in the same manner as in the first embodiment. Only the fan exhaust hole groups 121a and 121b are provided in the area upper than the middle area, and no natural exhaust hole group is provided in the middle area.

PRACTICAL EXAMPLE 1

No air hole is provided in the center are of the rear case 12 in the same manner as in the first embodiment. The fan exhaust holes 121a and 121b is provided in the area upper than the middle area, and the natural exhaust hole groups 122c, 122d and 122e are provided in the areas that are the above-mentioned certain distances a1 and a2 away from the area where the natural exhaust hole groups are provided.

FIG. 4 shows the results of the experiment using the examples above. The radiation effect is measured at points F1 to F6 shown in FIG. 2. F1 is a measuring point on the fin 184a provided in the vicinity of the fan exhaust hole groups 121a. F2 is a measuring point on the fin 184b provided in the vicinity of the fan exhaust hole groups 122a. In the same manner, F3 and F4 are respectively measuring points on the fins 185a and 185b. These measuring points are all provided within the forced convection areas S1 and S2. F5 is a measuring point on a signature processing circuit substrate 181 provided in the vicinity of the natural exhaust hole group 122c, and F6 is a measuring point on a TV tuner circuit substrate 183. F5 and F6 are provided within the natural convection area R2.

The results shows, for each of the points F1 to F6, the difference between the temperature of the comparative example 1 as a standard for comparison and the temperatures of the comparative example 2 and the practical example 1. The results show that the temperatures of the points F2 and F3 are each 5 to 6° C. lower than the temperature of the comparative example 1. It is believed that this is because the air taken from the intake hole groups 122a and 122b into the rear space is exhausted from the fan exhaust hole groups 121a and 121b without being obstructed or decreasing the flow speed.

As a result, the heat generated by the fins 184b and 185b, which are provided at positions that are in the vicinities of the intake hole groups 122a and 122b and at the bottom of the rear space, is exhausted outside without staying in the flow passage. This is preferable. Meanwhile, the temperature measured at the point F5 in the natural convection area R2 is higher than the temperature of the comparative example 1. However, the temperatures of the points F5 and F6 are inherently lower than the temperatures of the points F1 to F4 on the fins 184a, 184b, 185a and 185b that generate a large amount of heat. Accordingly, the temperatures of the points F5 and F6 are not at the level that requires consideration of occurrences of cracks or the like caused by heated soldering. Practically, temperatures at such a level can not be a cause of degradation of the durability of the display apparatus.

On the other hand, in the comparative example 2 having no natural air hole group in the upper area of the rear case 12 and only the fan exhaust hole groups 121a and 121b are provided in the upper area, all the temperatures are generally high. In this comparative example, although the air flow is not obstructed in the same manner as in the first embodiment, the temperatures are high. This means that the heat is not properly exhausted to outside. In other words, in the case where only the exhaust hole groups are provided as in this example, it is necessary to increase the exhaust amount from the air fans 171 and 172. However, this it not preferable because this might cause an increase of power consumption of the display apparatus and noise of the exhaust fans 171 and 172.

As described above, in the case of using the exhaust fans 171 and 172 to suppress the increase of the temperature due to the heat generated in the rear space, it is possible to improve the radiation effect in the rear space by providing the air holes to form the above-mentioned forced convection areas S1 and S2 and the natural convection areas R1, R2 and R3, and further providing the natural exhaust hole groups at the stated positions. This effect is remarkable especially in the case where electronic elements and electronic devices that generate the largest amount of heat are disposed in the forced convection areas S1 and S2. In this case, the durability of the display apparatus can be greatly improved. Such a structure securing the flow of the air from the bottom to the top of the rear space is especially effective for increasing the temperature in the case where the single-scan method is used, that is, in the case where a driver IC (not illustrated) used for driving the PDP 15 is used only at positions opposing the intake hole groups 122a and 122b. This is because it is likely that the heat stays at the bottom of the rear space and the temperature easily rises in such a case.

Regarding the positions of the natural exhaust hole groups, it is possible to achieve the effect when the distances a1 and a2 from the exhaust fans are respectively at least 0.6 times and 0.17 times of the amount of the air flow from the exhaust fan areas 171a and 172b (Expressions 1 and 2), and the effect increases as the distances increase. However, in view of the size of the rear case 12, it becomes difficult to form air holes for natural exhaust if the distances are more than 4 times. Therefore, it is preferable that the distance is not more than 4 times of the amount of the air flow from the exhaust fan areas 171a and 172b.

Figure 5A:
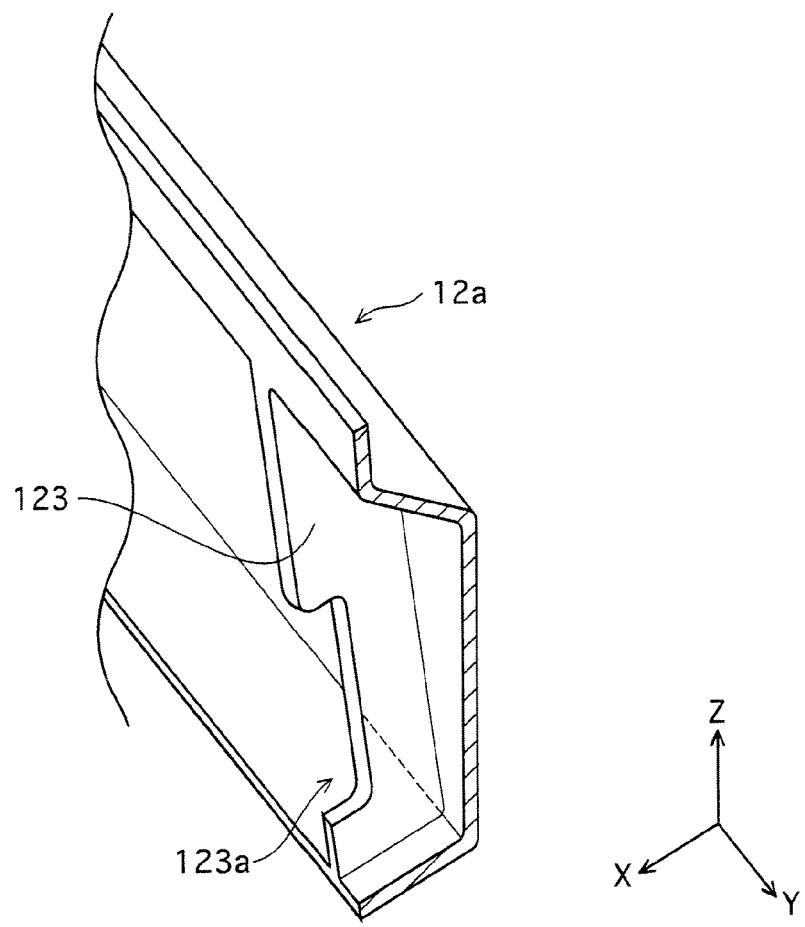
FIG. 5A is a partially cut away perspective view of a rear case having a partition plate.
Figure 5B:
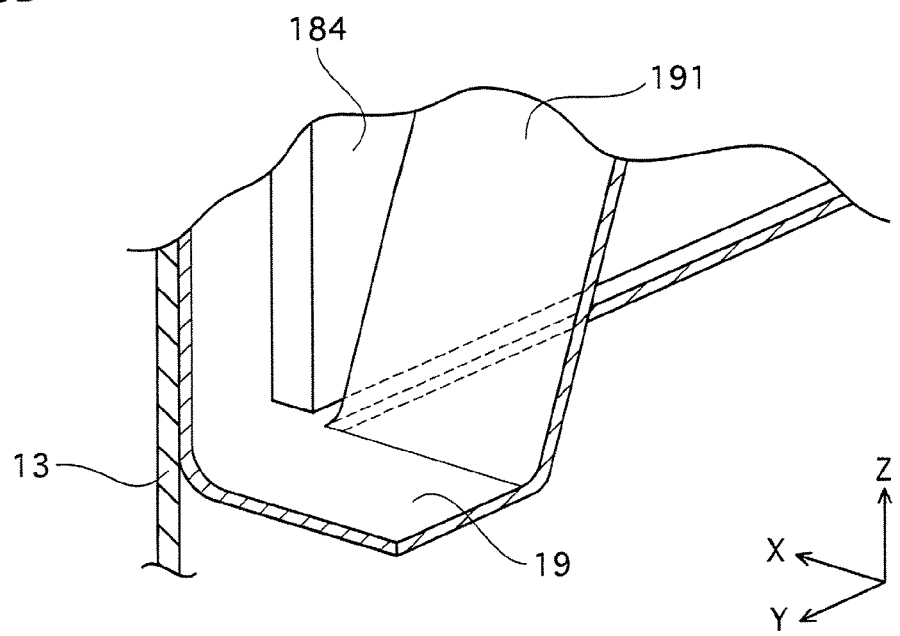
FIG. 5B is a perspective view of a chief part of an isolator having a partition plate.

In this embodiment, the forced convection areas S1 and S2 and the natural convection areas R1, R2 and R2 are formed in the rear space. Here, note that if a partition plate made of thermally-conductive metal such as aluminum is formed at each border of the convection areas, it is possible to certainly partition the areas. If such a partition plate is not used, the flow passage in the forced convection areas S1 and S2 might be obstructed by the flow of the air from the natural convection area R1, R2 and R3, even though it is not often. However, if the partition plate is used, it is possible to surely prevent such a problem. In other words, this structure is preferable because it can derive more of the performance of the exhaust fans 171 and 172, and further improve the radiation effect in the rear space. Also, a partition part 123 (see FIG. 5A) may be formed to be unitary with the rear case 12a instead of newly providing the partition plate. If this is the case, it is preferable that a cut-out part 123a is provided in the partition part 123 so as to correspond to the position of the circuit substrate and so on. In addition, if an insulator 19 is intervened between the frame chassis and the circuit substrates 184 and 185 to maintain isolation therebetween, a part 191 of the isolator 19 is folded over the circuit substrate 154 and so on, as FIG. 5B shows. The isolator can be easily folded by thermoforming or the like.

Figure 6:
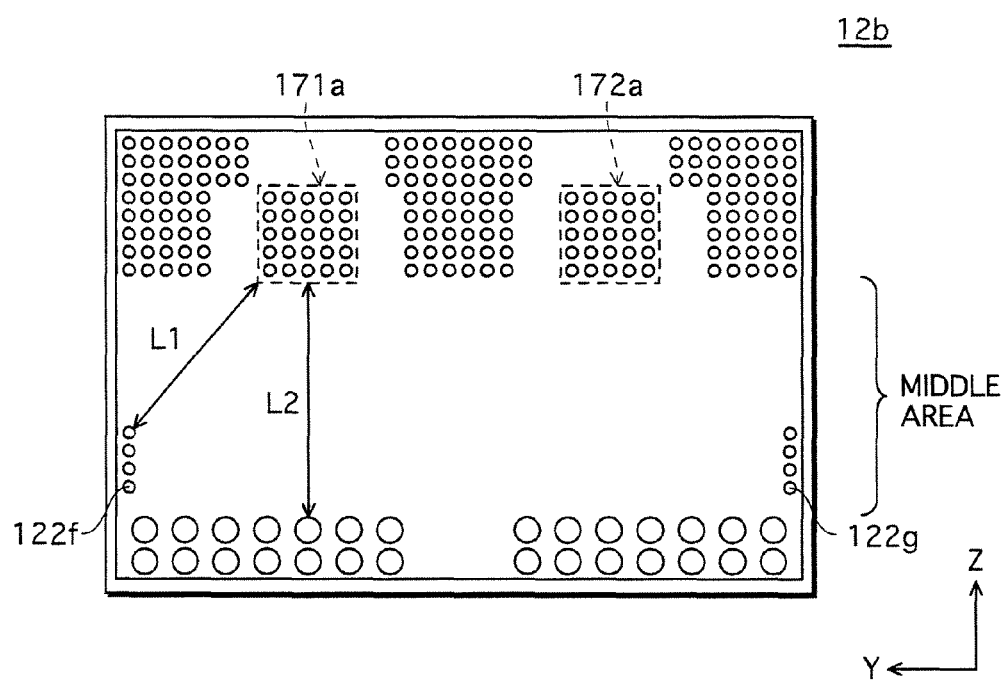
FIG. 6 is a plan view schematically showing the rear case having air holes at margins of a shielded area according to the first embodiment.

In this embodiment, no air hole is provided in the shielded area. However, even if air holes 122f and 122g are provided in the shielded area, they do not obstruct the air flow in the forced convection areas S1 and S2 as long as the air holes 122f and 122g are provided in the natural convection areas R1, R2 and R3 (e.g. provided at margins of the middle area of the rear case 12b as shown in FIG. 6). Therefore, such air holes 122f and 122g provided in the margins are acceptable. If this is the case, however, it is preferable that the minimum distance L1 from the fan areas 171a and 172a to the air holes provided in the margins is not shorter than the minimum distance L2 from the fan areas 171a and 172a to the intake hole groups 122a and 122b.

Figure 7:
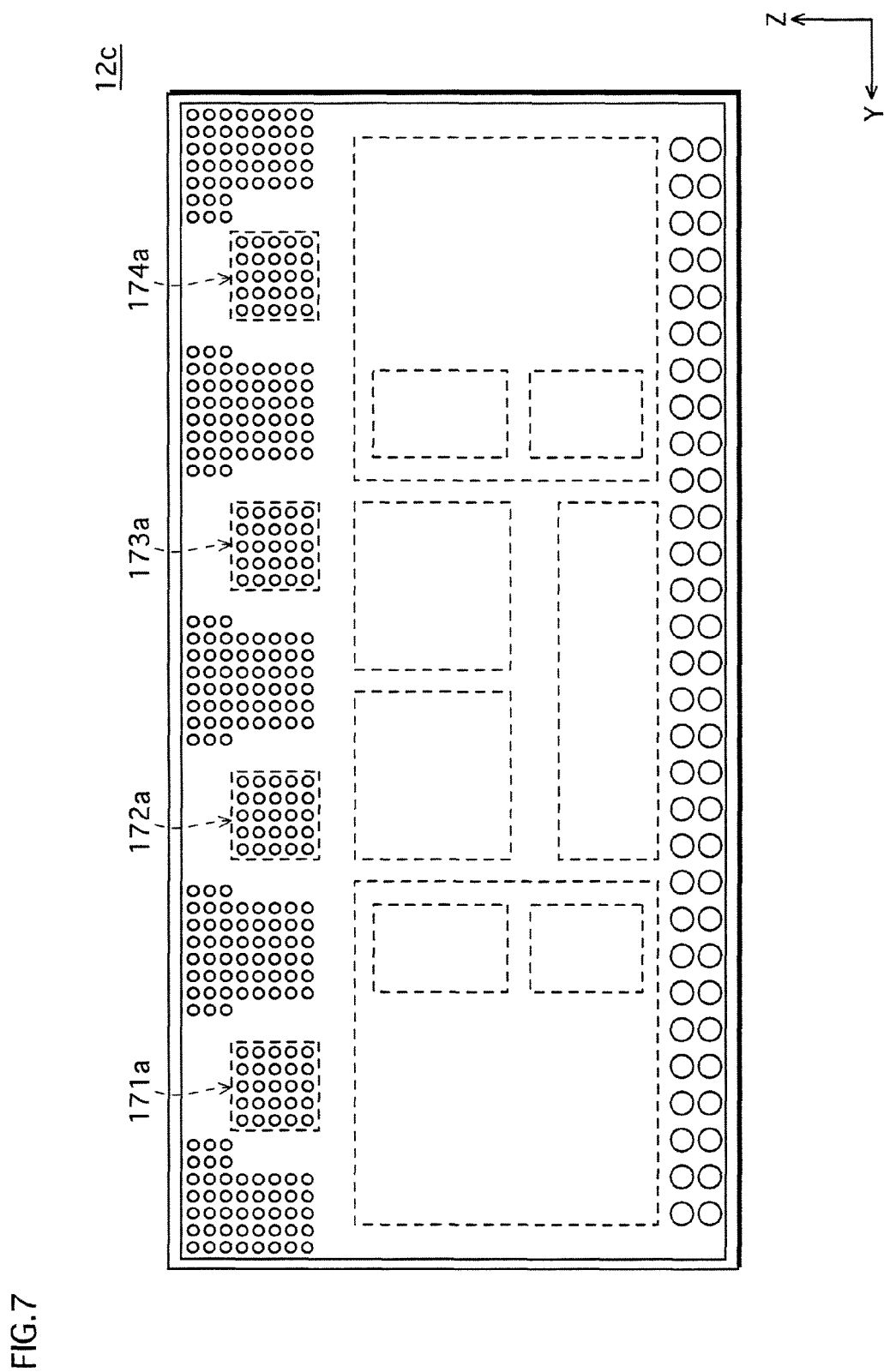
FIG. 7 is a plan view schematically showing a rear case according to the first embodiment, in the case where there are four exhaust fans.

Moreover, in this embodiment, only two fans, namely the exhaust fans 171 and 172 are used. However, the number of fans is not limited as long as they are provided in the upper part of the rear space at almost the same level, such that the forced convection areas can be formed. For example, four exhaust fans may be put side by side and the exhaust hole groups and the intake hole groups may be formed in the rear case 12c as shown in FIG. 7. Especially, in the case where the display apparatus is large, the amount of heat to be generated necessarily becomes large. Accordingly, further improvement of the exhaust performance is required. Note that the fan areas are positioned at substantially equal intervals in the horizontal direction, and the fan exhaust hole groups are formed within the fan areas as a matter of course. The natural exhaust hole groups are respectively formed at a certain distance from the fan exhaust hole groups.

MODIFICATION EXAMPLE 1

Figure 8:
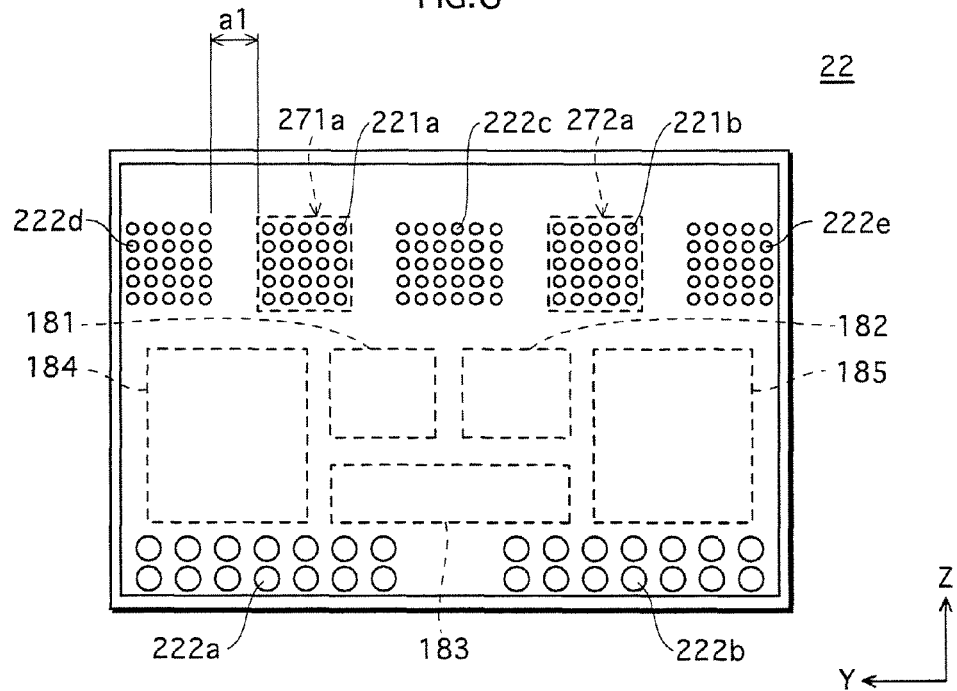
FIG. 8 is a plan view schematically showing a rear case according to a modification example 1.

The following describes a modification example 1 of the present invention, with reference to FIG. 8. FIG. 8 is a plan view schematically showing a PDP apparatus viewed from the rear side. This modification example is the same as the first embodiment above, except for the natural exhaust hole groups. Accordingly, the description of the same parts is omitted.

As FIG. 8 shows, natural exhaust hole groups 222c, 222d and 222e are provided in a rear case 22 along with air intake holes 222a and 222b. The natural exhaust hole group 222c is provided in substantially the middle of the natural exhaust hole groups in the horizontal direction (Y direction). The areas where the exhaust hole group 221a and 221b are formed are respectively included in fan areas 271a and 272a. Fan areas 271a and 272a are each provided at a certain distance from the exhaust hole group 222c. The natural exhaust hole groups 222d and 222e are respectively provided in the vicinities of the margins of the rear case 22. The exhaust hole groups 222d and 222e are respectively positioned at a certain distance from the fan areas 271a and 272a. All the certain distance mentioned above are a1 (m). As described above, a1=0.6b is satisfied, where b (m3/min.) is an exhaust amount of the fan.

Also in this modification example, the forced convection areas and the natural convection areas are formed in the rear space. Accordingly, it is possible to effectively radiate the generated heat by providing fins or the like on the scan drive circuit substrate 184. Also, the partition plate may be used in the same manner to certainly partition the rear space.

MODIFICATION EXAMPLE 2

Figure 9:
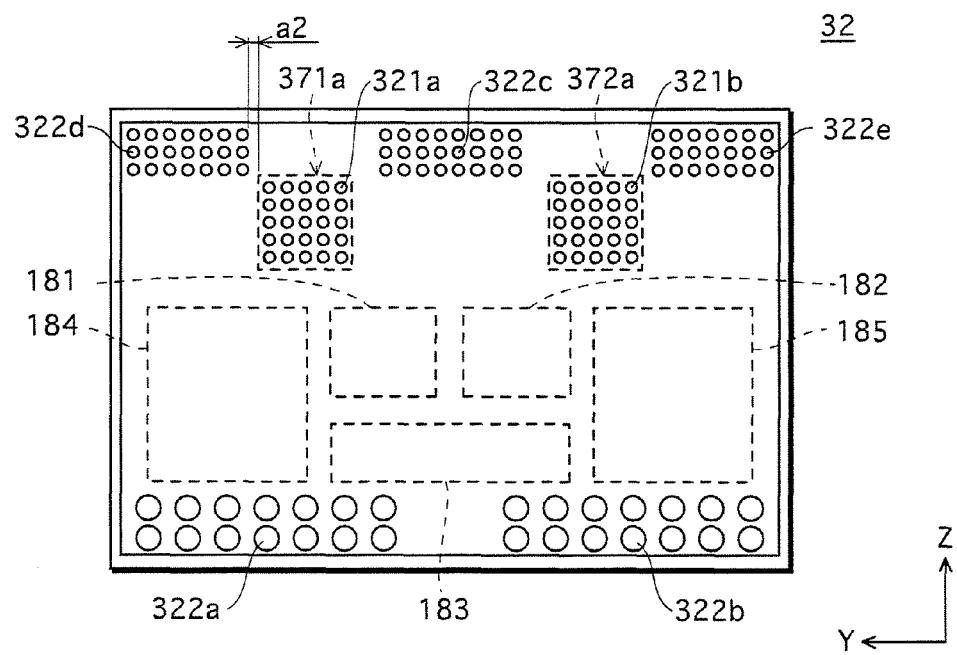
FIG. 9 is a plan view schematically showing a rear case according to a modification example 2.

Another modification example is explained next with reference to FIG. 9. FIG. 9 is a plan view schematically showing a PDP apparatus viewed from the rear side. This modification example is also the same as the first embodiment above, except for the natural exhaust hole groups. Accordingly, the description of the same parts is omitted.

As FIG. 9 shows, natural exhaust hole groups 322c, 322d and 322e are provided in a rear case 32, and they are positioned in a part that is higher than fan areas 371a and 372a (positioned on the side indicated by the arrow Z) so as to be at a distance a2 in the horizontal direction (Y direction) from the fan areas 371a and 372a respectively. As described above, a2=0.17b is satisfied, where b (m3/min.) is an exhaust amount of the fan. The areas where the exhaust hole groups 321a and 321b are formed are respectively included in fan areas 371a and 372a. The rear case 32 also includes air intake holes 322a and 322b.

The structure of this modification example also can achieve effective radiation. The partition plate may be used in the same manner to certainly partition the rear space.

Second Embodiment

Another embodiment different from the first embodiment is described next, with reference to FIG. 10. FIG. 10 is a plan view schematically showing the rear side of a PDP apparatus. The second embodiment is the same as the first embodiment, except for the positions of the natural exhaust hole groups and the partitioning of the rear space. Accordingly, the description of the same parts is omitted.

As FIG. 10A shows, a rear case 42 is divided in the three areas (illustrated in FIG. 10A as the first area the second area and the third area) in the horizontal direction (Y direction). Fan exhaust hole groups 421a and 421b are respectively formed in areas higher than center areas of the first and the third areas, and included in fan areas 471a and 472a. Also, intake hole groups 422a and 422b are formed in areas lower than the center areas. Also, a plurality of air holes are provided all over the second area.

Partition plates I11 and I12 made of thermally-conductive metal such as aluminum is disposed at the border between the first and second areas, and the border between the second and the third areas. Accordingly, the rear space is partitioned into the forced convection areas (equivalent to the first and the third areas) and the natural convection area (equivalent to the second area) as in the first embodiment.

In the forced convection areas, electronic devices that generate a large amount of heat such as the scan drive circuit substrate 184 and the sustain drive circuit substrate 185 are disposed. In particular, if fins or the like for radiating the heat generated by the electronic devices are provided, it is possible to effectively radiate the heat from the rear space. In this embodiment, the rear space is certainly divided into the forced convection areas and the natural convection area by the partition plates I11 and I12. Accordingly, even if many air holes are provided in the second area as illustrated, the air from the air holes does not flow into the forced convection areas. In other words, in the same manner as in the first embodiment, any new flow of air does not intrude into the flow passage of the air taken from the intake hole groups 422a and 422b and exhausted to outside from the fan exhaust hole groups 421a and 421b, because no air holes is provided in the forced convection areas. Accordingly, a smooth flow passage of the air can be secured, and the air does not stay at the bottom. As a result, the heat radiation function using the exhaust fans can be fully achieved in the forced convection areas.

Also, in the natural convection area, since air holes are provided all over the rear case 42, air intake and air exhaust are fully performed, and effective heat radiation can be achieved. In particular, since the exhaust fans are not provided in the natural convection area, it is unnecessary to consider not forming air holes that become causes of intrusion of air into the flow passage in the forced convection areas and so on. Accordingly, in terms of the air circulation, it is preferable that as many air holes as possible are provided as long as sufficient strength of the rear case 42 can be secured.

In the same manner as in the first embodiment, the temperatures were measured as to the second embodiment. FIG. 10B shows the results. In the same manner as in the first embodiment, the results show, for each measuring point, a temperature difference between the second embodiment and the comparative example 1 as a standard for comparison. The exhaust fans used in the second embodiment provide the same performance of those used in the first embodiment. Also, the measuring points are the same as those in the first embodiment. Note that the measuring points are not illustrated in FIG. 10 for the sake of simplification of the drawing (See FIG. 2A).

The results show that the temperatures of the bottom parts of the scan drive circuit substrate 184 and the sustain drive circuit substrate 185 (the points F2 and F4) are each 6 to 9° C. lower than the temperature of the comparative example 1. This means that the degree of the decrease in the temperature is more than that of the first embodiment. It is believe that this is because the forced convection areas are partitioned by the partition plates I11 and I12 and the air of the natural convection area substantially does not intrude into the forced convection areas. As a result, the flow passage of the air is further secured compared with the first embodiment, and accordingly the heat radiation performance is improved even the exhaust fans having the same exhaust amount as the first embodiment are used.

Meanwhile, in the natural convection area including the measuring points F5 and F6 (see FIG. 2A), the partition plates I11 and I12 prevents intrusion of the large amount of the heat generated by the scan drive circuit substrate 184 and so on disposed in the forced convection areas. This can suppress the rise of the temperature in the natural convection area.

Note that although the partition plates I11 and I12 are used in the second embodiment, they are not necessary if the a natural exhaust hole group 422c' is provided as FIG. 10C shows to form the forced convection areas and the natural convection area in the rear space such that an air flow T1 in the forced convection area is not obstructed by the air flow U1 of the air from the natural convection area.

Third Embodiment

Figure 11:
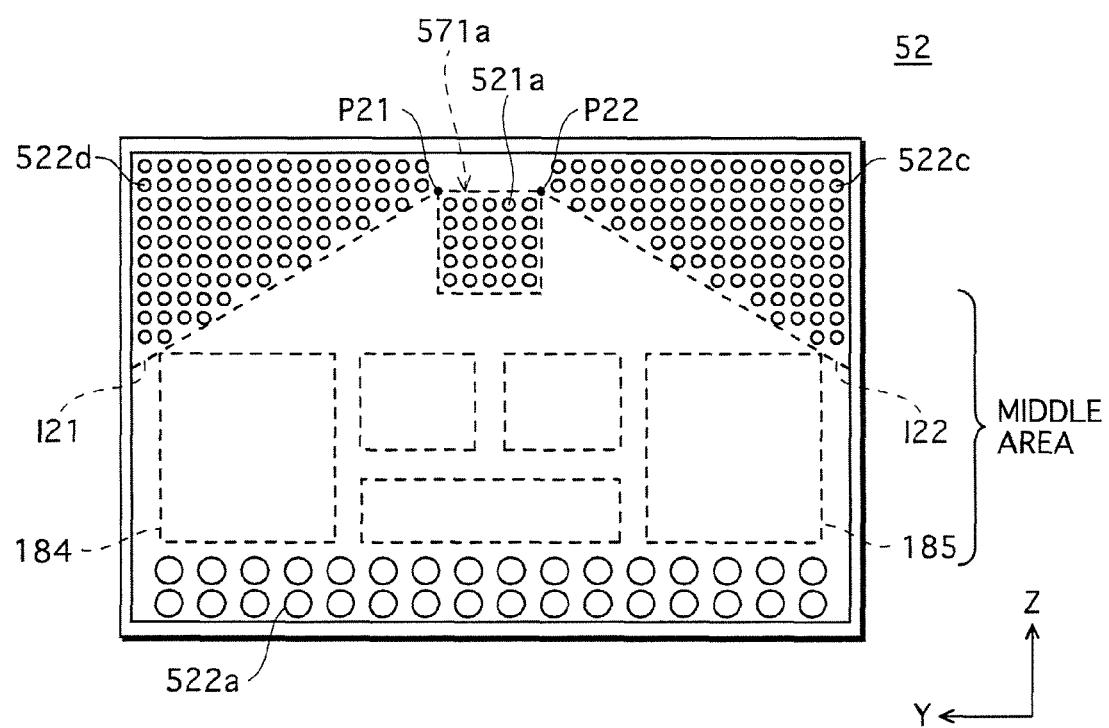
FIG. 11 is a plan view schematically showing a rear case according to the third embodiment.

The following mainly describes differences from the first embodiment and the second embodiment described above, with reference to FIG. 11. FIG. 11 is a plan view schematically showing a PDP apparatus viewed from the rear side. The differences are, namely, the configurations of the fan exhaust hole groups and the natural exhaust hole groups, and the position of the partition plate. Explanations of other parts are omitted.

In the third embodiment, only one exhaust fan is used. A fan area 571a corresponding to the fan is positioned upper than the middle area (positioned on the side indicated by the arrow Z), and substantially in the middle of the middle area in the horizontal direction (Y direction) The area where the exhaust hole groups 521a is formed is included in fan area 571a. Partition plates 121 and 122 are disposed such that upper corner points P21 and P22 become ends points of the partition plates 121 and 122, thereby the rear space is divided into the forced convection area and the natural convection area. The partition plates 121 and 122 are positioned such that at least the scan drive circuit substrate 184 and the sustain drive circuit substrate 185 are included in the forced convection area as shown in the drawing.

The positions of the partition plates I21 and I22 are not limited to those shown in the drawing. They may be disposed such that the forced convection area is smaller than that shown in FIG. 11, because even if the forced convection area is reduced, the radiation effect can be improved as long as the parts that generate a large amount of heat is included within the forced convection area. However, it is necessary that no air hole, such as the intake hole and the exhaust hole, is formed within the forced convection area.

Also, although it is preferable that the air holes of the natural exhaust hole groups 522c and 522d are evenly provided as shown in the drawing, this not necessary. In the same manner, the air holes of the intake hole group 522a formed at the bottom of the rear case 52 (the side opposite to the side indicated by the arrow Z) are not necessarily evenly provided in the horizontal direction (Y-direction). However, this is preferable that they are evenly provided because the air taken in can be constantly led toward the top.

In the same manner as in each of the above-described embodiments, the third embodiment can secure a smooth flow of the air in the forced convection area, and improve the radiation performance in the rear space. Also, since the third embodiment effectively uses the function of the natural exhaust hole groups and the number of the exhaust fans is decreased, the power consumption can be reduced.

Note that the partition plates I21 and I22 are not necessary as long as the air holes are provided such that the radiation effect in the rear space can be improved.

Fourth Embodiment

Overall Structure

Figure 12:
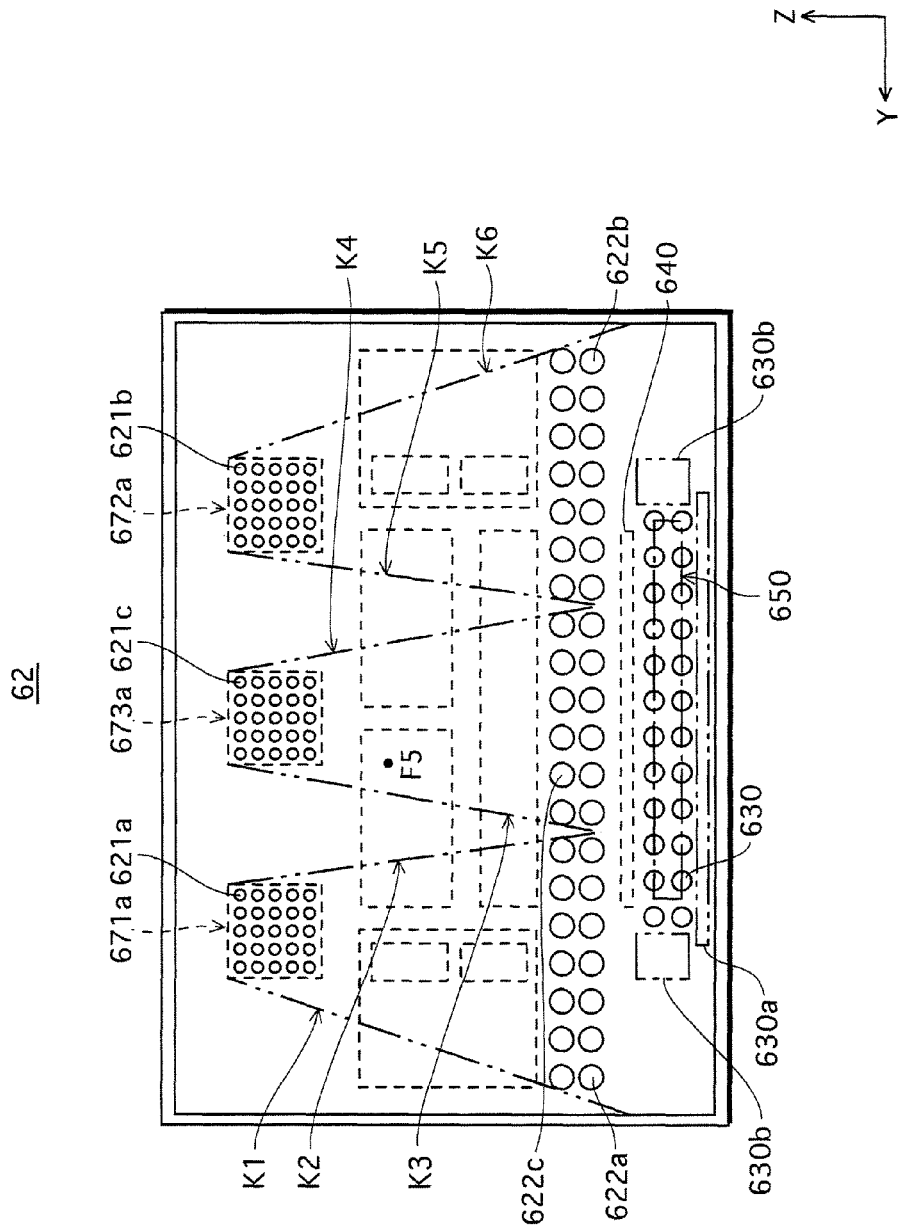
FIG. 12 is a plan view schematically showing a rear case according to the fourth embodiment.

The following describes a PDP apparatus according to the fourth embodiment in which air holes are provided at positions lower than the above-described intake hole groups, with reference to FIG. 12. Mainly, the differences from each of the above-described embodiment are described here. FIG. 12 is a plan view schematically showing a PDP apparatus according to the fourth embodiment viewed from the rear side.

The PDP apparatus of this embodiment has three exhaust fans. As the drawing shows, three fan exhaust hole groups 621a, 621b and 621c, intake hole groups 622a, 622b and 622c are provided in a rear case 62, and air hole group 630 (hereinafter called the "bottom air hole groups") are provided at the position lower than the intake hole groups 622a, 622b and 622c with respect to the vertical direction (Z direction). The areas where the fan exhaust hole groups 621*a*, 621*b*, and 621*c* are formed are respectively included in fan areas 671*a*, 672*a*, and 673*a*. Note that a partition plate 640 is disposed between the bottom air hole groups and each of the intake hole groups 622*a*, 622*b* and 622*c*.

The forced convection areas that are the same as that of each of the above-described embodiments are formed with the fan exhaust hole groups 621*a*, 621*b* and 621*c* and the intake hole groups 622*a*, 622*b* and 622*c* provided as the drawing shows. Note that the virtual lines (the external common tangents) that form the forced convection areas are represented by K1, K2, K3, K4, K5 and K6.

The bottom air hole group 630 is located in an area lower than the intake hole groups 622*a*, 622*b* and 622*c*, and in substantially the middle of a rear case 62 in the horizontal direction (Y-direction). Also, in the PDP apparatus according to the fourth embodiment, a plurality of data driver ICs (not illustrated) for driving the data electrodes are disposed so as to oppose the bottom air hole groups 630. The ICs are disposed only on the part opposing the bottom air hole groups 630, and a driving method using the ICs, namely, the single-scan method is used in the PDP according to this embodiment. Note that a radiation plate (not illustrated) for effectively radiating the heat generated by the ICs is also provided between the data driver ICs and the bottom air hole groups 630. The position of the radiation plate is represented as an area 650 surrounded by a dashed line illustrated in FIG. 12. This embodiment is characterized by that the bottom air hole groups 630 are provided in the PDP apparatus using the single-scan method. This characteristic is described later in detail.

The partition plate 640 extends in the Y direction, and has a length similar to the length of the area in which the above-described data driver ICs are disposed. The partition plate 640 blocks the movement of the air in the area in which the above-described data driver ICs are disposed.

Effect of the Bottom Air Hole Group 630

Figure 13A:
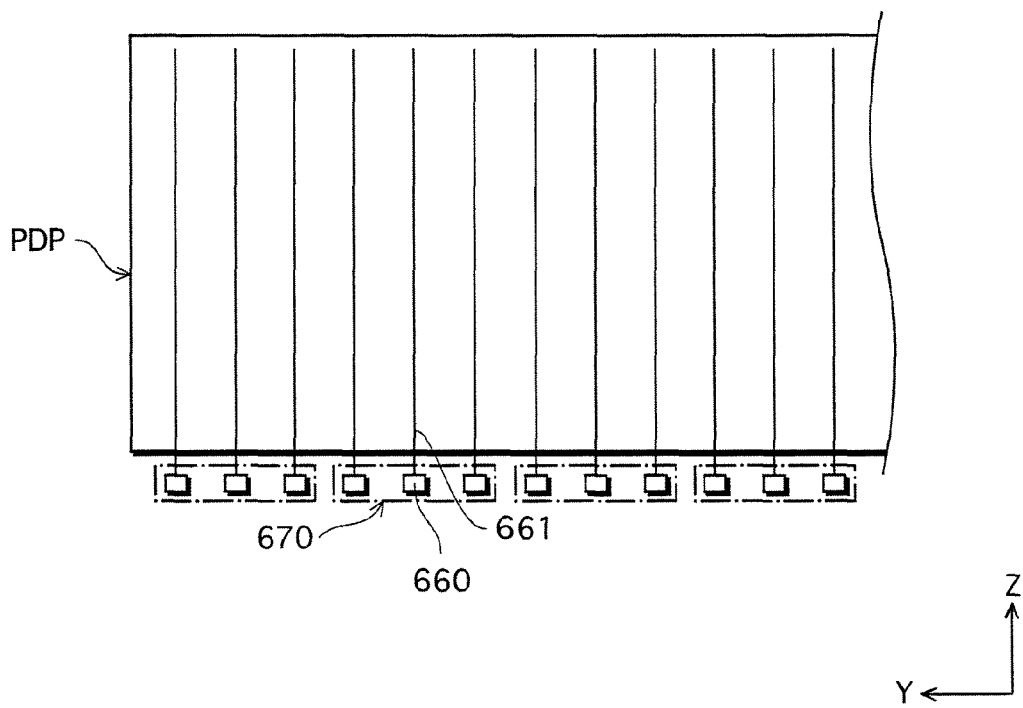
FIG. 13 is a conceptual diagram of data electrodes according to the fourth embodiment.
Figure 13B:
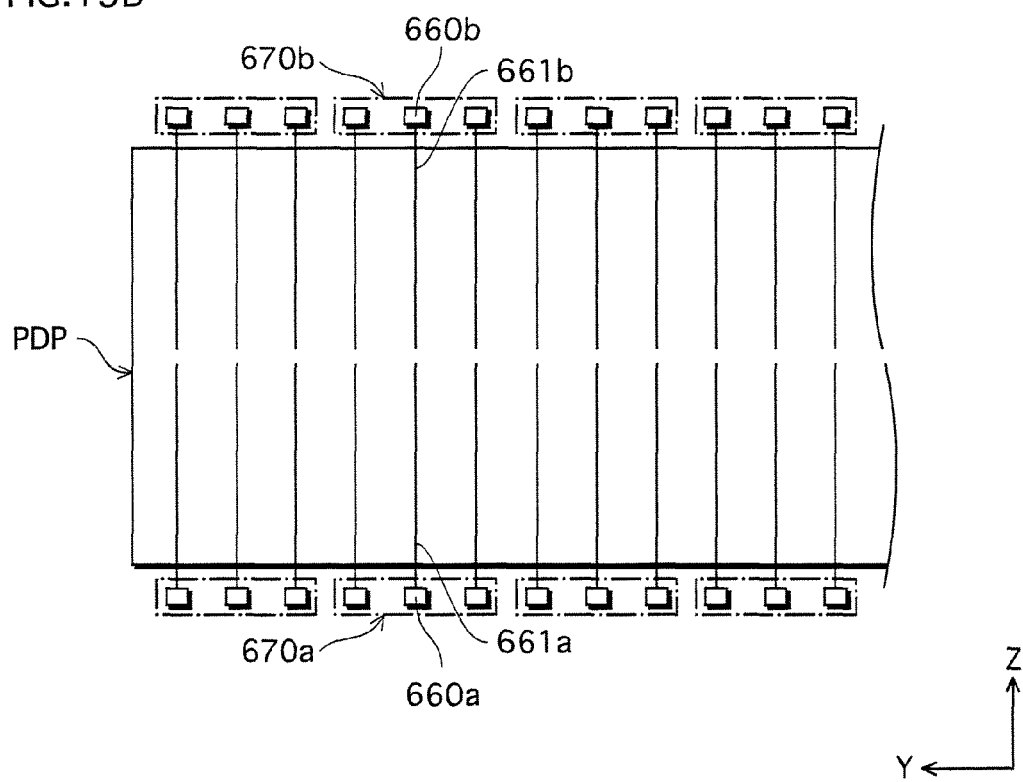
Figure 15:
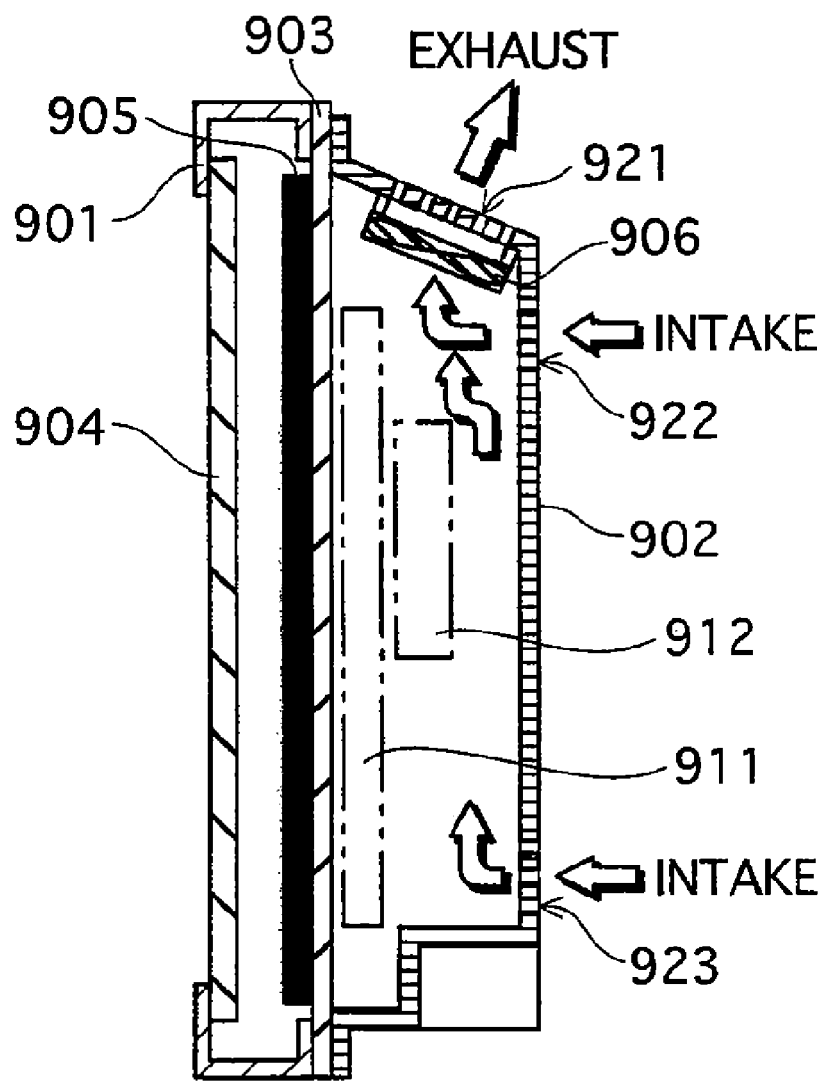
FIG. 15 is a lateral cross-section view of a PDP apparatus according to a conventional example.

As FIG. 13A shows, in the PDP apparatus according to the fourth embodiment, the data driver ICs 660 for the data electrodes 661 are located only at the bottom of the PDP. In FIG. 13A, a part 670 surrounded by a dashed line represents the radiation plate. Three of the data driver ICs 660 oppose the one radiation plate 670. However, these numbers are not limited to this, and any other numbers may be applied. Each of the data driver ICs 660 contributes to the driving of the data electrodes extending in the Z direction. As a driving method for driving the data electrodes, so-called double-scan method is well known. In this method, data driver ICs 660*a* and 660*b* having the same capability as the data driver IC 660 are respectively disposed at the top part and the bottom part of the PDP such that the data electrodes 661*a* and 661*b* respectively extend from the data driver ICs 660*a* and 660*b* to substantially the middle of the PDP with respect to the height direction (See FIG. 13B). Three of the data driver ICs 660*a* oppose the one radiation plate 670*a* while three of the data drivers ICs 660*b* oppose the one radiation plate 670*b*. In the single-scan method compared to the double-scan method, the number of the data driver ICs can be reduced by half, and the data driver circuit can be simplified. Accordingly, there is an advantage that the manufacturing cost can be reduced. However, there also is a disadvantage that power consumption per each data driver IC greatly increases. The reason is the following: The power consumption (P) is calculated by P=Driving frequency (f)×Panel load capacity (C)×Square of data voltage (V2). As in the As the length of the electrode is almost twice as the electrode of the double-scan method, the driving frequency and the panel load capacity are each approximately twice. As a result, the power consumption per each data driver IC is four times as large as that of the double-scan method. If the power consumption increases greatly in this way, the temperature is risen by the heat generated by the power. This deteriorates not only the thermal resistance of the data driver, but also the capability of the PDP apparatus.

Given this, the inventors of the present invention provides, in the rear case 62, the bottom air hole group 630 at a part opposing the part where the data driver IC 660 is disposed, or in the vicinity of the part, and measures the temperature of the PDP apparatus. Based on the results of the measurement, the inventors have considered the effect of suppressing the rise of the temperature of the PDP using the following practical examples and comparative examples.

PRACTICAL EXAMPLE 1

A PDP apparatus in which the bottom air hole group 630 according to the fourth embodiment and the partition plate 640 are provided.

PRACTICAL EXAMPLE 2

A PDP apparatus in which the bottom air hole group 630 is provided as in the practical example 1, but the partition plate 640 is not provided.

PRACTICAL EXAMPLE 3

A PDP apparatus in which the partition plate 640 is provided as in the practical example 1, but the bottom air hole group 630 is provided only at a bottom part 630*a* that is lower than the position in the practical example 1.

PRACTICAL EXAMPLE 4

A PDP apparatus in which the partition plate 640 is provided as in the practical example 1, but the bottom air hole group 630 is provided only on a part 630*b* (hereinafter simply called "adjoining part") that adjoins the part where the bottom air hole group 630 of the practical example 1 is provided.

COMPARATIVE EXAMPLE 3

A PDP apparatus in which the bottom air hole group 630 is provided as in the practical example 1, but the partition plate 640 and the air hole group 622*c* as intake holes are not provided.

COMPARATIVE EXAMPLE 4

A PDP apparatus in which the bottom air hole group 630 and the partition plate 640 are not provided unlike the practical example 1, but the air hole group 622*c* is provided unlike the comparative example 1.

FIG. 14 shows the results of the temperature measurement using the practical examples 1-4 and the comparative examples 3 and 4. In FIG. 14, the position where the bottom air hole group 630 of the practical examples land 2 is formed as shown in FIG. 12 is represented as "rear part", and such a position of the practical example 3 is represented as "bottom part", and such a position of the practical example 4 is represented as "adjoining part". As the results clearly show, the practical example 1 most effectively suppresses the rise of the temperature, and this effect is remarkable especially when compared with the comparative example 4 in which the bottom air hole group 630 is not provided. This is firstly because the heat radiated by the radiation plate 670 is exhausted to outside from the bottom air hole group 630 and the rise of the temperature of the data driver ICs is suppressed. Secondly, because the heat generated by the data driver ICs does not rise toward the top part of the rear space (e.g. a space including the signal processing circuit substrate 181 (See FIG. 1B) due to the partition plate 640, and the rise of the temperature of the panel center is suppressed. Especially, in the case of the single-scan method, the power consumption of the data driver ICs is large, it is preferable that the heat generated by the data driver ICs are immediately exhausted from the PDP apparatus. Also, since the temperature of the signal processing circuit substrate 181 and so on easily and remarkably rises due to driving of the PDP apparatus no matter which between the single-scan method and the double-scan method is used, it is preferable that the heated air is prevented from being intruding the space including the signal processing circuit substrate 181. Therefore, the practical example 1 is the most favorable, because the practical example 1 having the bottom air hole group 630 and the partition plate 640 can suppress the rise of the temperature of the area that generates a large amount of heat, without using the function of the exhaust fans.

In addition, in comparison with the comparative example 4, it is clear that the practical example 2 achieves the remarkable effect of the bottom air hole group 630. Regarding the practical example 2, although it is different from the practical example 1 in that the partition plate 640 is not provided, the bottom air hole group 630 greatly suppresses the temperature rise, and it is believed that the heat generated by the data driver ICs is certainly exhausted outside the PDP apparatus via the bottom air hole group 630.

Moreover, in comparison with the comparative example 4, it is also clear that the practical examples 3 and 4 achieve the remarkable effect. In other words, although the bottom air hole group 630 is not provided in the area 650 opposing the radiation plate 670 but provided in the bottom part 630a (practical example 3) or the adjoining part 630b (practical example 4), the area including the bottom air hole group 630 as in the practical examples 1 and 2 produces its own intake effect that is different from the space including the above-mentioned forced convection area and the natural convection area. As a result, the heat generated by the data driver ICs is exhausted to outside of the PDP apparatus. This enhances the effect of suppressing the rise of the temperature of the data driver ICs. Almost all the heat generated by the data driver ICs is prevented from flowing into the upper space such as the forced convection area, and this suppresses the rise of the temperature thereof. In the practical examples 3 and 4, although the partition plate 640 is provided, the temperature of the PDP center part is higher than that of the practical example 1. It is believe that this is because some of the heat generated by the data driver ICs intrudes into the upper side of the rear space by making a detour around the partition plate 640. Therefore, it is believe that the effect of suppressing the rise of the temperature can be enhanced by providing a partition plate 640 so as to surround the area in which the data driver ICs are formed, instead of limiting the area where the partition plate 640 is formed to the area above the bottom air hole group 630 as shown in FIG. 12. Accordingly, the partition plate 640 may form a separated space by surrounding the bottom air hole group 630 instead of only extending in the horizontal direction (see FIG. 12).

In the practical examples 1-4, the bottom air hole group 630 is provided in the opposing part to the data driver ICs (equivalent to the "rear part" in FIG. 14), the bottom part or the adjoining part, and the above-described effect can be achieved if the bottom air hole group 630 is provided in an area including at least one of the above-described parts. Accordingly, the bottom air hole group 630 may be formed in any combination of these parts.

As shown in the practical example 2, the bottom air hole group 630 can achieve the effect of suppressing the temperature. Therefore, it is not essential to provide the partition plate 640 in the stated status to apply this example. However, it is preferable that the intake hole group 622c and the bottom air hole group 630 are provided with a certain distance in the vertical direction (Z direction). The certain distance above is larger than the interval between the air holes included in the in-take air group 622c in the vertical direction and larger than the interval between the air holes included in the bottom air hole group 630 in the vertical direction.

In this embodiment, as FIG. 12 shows, the bottom air hole group 640 is formed in the middle area of the rear case 62 away from the both ends of the rear case 62, and in the vicinity of the middle area.

In the rear case 62, air holes other than the fan exhaust hole groups 621a, 621b and 621c are not provided in the area upper than the intake hole groups 622a, 622b and 622c. However, air holes may be provided in the natural convection area as shown in FIG. 1 to FIG. 3.

Other Issues

The air holes serving as the intakes hole and the exhaust holes each have a circular cross section. However, the shape of the cross section of each hole is not limited to this. The air holes may be in other shapes, such as an elliptical shape and a polygonal shape.

The intake hole groups and the exhaust hole groups are evenly distributed. However, they may be scattered as long as they can function properly.

Also, the number of the exhaust fans may be increased to three, four or more in accordance with the increase in size of the display apparatus, because the same effect can be achieved by adjusting the position of the air holes.

Moreover, the partition plate may not be provided all over the above-described area. For example, the partition plate may have cut-outs, or may be provided with certain intervals, because the same effect of lowering the temperature can be achieved with such structures. Also, instead of newly providing the partition plate, it is possible to use existing members, such as the tuner box and the rib of the frame chassis. Furthermore, the material for the partition plate is not limited to the thermal-conductive material such as Al. For example, thermal non-conductor such as synthetic resin, rubber, may be used.

Regarding other members, it is possible to use a different shape and a different material as long as the purpose of the present invention is served. For example, the shape of the frame chassis 13 may have a mesh shape.

The display panel is not limited to the PDPs. The present invention is applicable to FEDs (Field Emission Display) such as SEDs (Surface-conduction Electron-emitter Display), and thin-model displays such as organic ELs (Electro Luminescence) and liquid crystal panels.

INDUSTRIAL APPLICABILITY

The display apparatus according to the present invention can be used for various displays, because it can achieve effective radiation, high reliability and a long life.

The invention claimed is:

1. A display apparatus comprising
a display panel for displaying images;
a rear case covering a rear side of the display panel, the rear case including a first air-hole area, a second air-hole area, and a third air-hole area, each provided with a plurality of air holes, wherein the first air-hole area is located at a higher level than the second air-hole area with respect to a vertical direction with a spacing therebetween, and an area surrounded by the first air-hole area, the second air-hole area, and external common tangents between the first air air-hole area and the second air-hole area, is a shielded area in which no air hole is provided;
a drive circuit for driving the display panel disposed in an inner space surrounded by the display panel and the rear case, the drive circuit including a circuit substrate on which a plurality of electronic parts are mounted, wherein in the inner space, an electronic part that generates the largest amount of heat among the plurality of electronic parts is located in a space between the shielded area and the display panel;
an exhaust fan disposed within the rear case, wherein the first air-hole area at least partially faces the exhaust fan, and the third air-hole area is located a prescribed distance away from the exhaust fan; and
a partition disposed along the external common tangents.

2. The display apparatus of claim 1, wherein the inner space is separated by the partition.

3. A display apparatus comprising:
a display panel for displaying images;
a rear case covering a rear side of the display panel including a first air-hole area, a second air-hole area, and a third air-hole area, each provided with a plurality of air holes, wherein the first air-hole area is located at a higher level than the second air-hole area with respect to a vertical direction with a spacing therebetween, the third air-hole area is located at a lower level than the second air-hole area with respect to the vertical direction with a spacing therebetween, and an area surrounded by the first air-hole area, the second air-hole area, and external common tangents between the first air air-hole area and the second air-hole area is a shielded area in which no air hole is provided;
a drive circuit for driving the display panel is disposed in an inner space surrounded by the display panel and the rear case, the drive circuit including a circuit substrate on which a plurality of electronic parts are mounted, wherein in the inner space, an electronic part that generates the largest amount of heat amount the plurality of electronic parts is located in a space between the shielded area and the display panel;
a data driver IC disposed in the inner space so as to face the third air-hole area;
an exhaust fan disposed within the rear case, wherein the first air-hole area at least partially faces the exhaust fan, the third air-hole area is located a prescribed distance away from the exhaust fan; and
a partition disposed between the third air-hole area and the second air-hole area so that a flow of air in the vertical direction is obstructed, the partition having a size that fits a size of an area where the data driver IC is disposed.

* * * * *

UNITED STATES PATENT AND TRADEMARK OFFICE
CERTIFICATE OF CORRECTION

PATENT NO. : 7,755,893 B2
APPLICATION NO. : 11/816650
DATED : July 13, 2010
INVENTOR(S) : Yanagawa et al.

It is certified that error appears in the above-identified patent and that said Letters Patent is hereby corrected as shown below:

On the Cover Page of the Patent
(56) References Cited
OTHER PUBLICATIONS: English translation of Japanese pubuication JP2001-035397 - "pubuication" is misspelled and should read "publication".

Signed and Sealed this

Sixteenth Day of November, 2010

David J. Kappos
*Director of the United States Patent and Trademark Office*